US011313909B2

(12) United States Patent
Williamson et al.

(10) Patent No.: US 11,313,909 B2
(45) Date of Patent: Apr. 26, 2022

(54) SYSTEM AND METHOD OF LOW POWER SWITCH STATE DETECTION (71) Applicant: Silicon Laboratories Inc., Austin, TX (US)

(72) Inventors: Matthew R. Williamson, Austin, TX (US); Sebastian Ahmed, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 17/100,286

(22) Filed: Nov. 20, 2020

(65) Prior Publication Data

US 2022/0074991 A1 Mar. 10, 2022

Related U.S. Application Data (60) Provisional application No. 63/074,566, filed on Sep. 4, 2020.

(51) Int. Cl.
*G01R 31/327* (2006.01)
*H03K 5/24* (2006.01)
*H03K 19/21* (2006.01)

(52) U.S. Cl.
CPC ......... *G01R 31/3278* (2013.01); *H03K 5/24* (2013.01); *H03K 19/21* (2013.01)

(58) Field of Classification Search
None
See application file for complete search history.

(56) References Cited

U.S. PATENT DOCUMENTS

| 2009/0085610 | A1* | 4/2009 | Westwick | ............... | H03K 5/24 |
| | | | | | 327/68 |
| 2017/0005646 | A1* | 1/2017 | Hargreaves | .............. | H03K 5/02 |

* cited by examiner

*Primary Examiner* — Cassandra F Cox
(74) *Attorney, Agent, or Firm* — Gary Stanford; Huffman Law Group, PC (57) ABSTRACT A switch sensor for sensing a state of a switch including a programmable memory, pulse generation circuitry, and comparator circuitry. The memory stores a state value indicative of a detected state of the switch. The pulse generation circuitry provides a pulse-train voltage signal to a first end of the switch, in which the pulse-train voltage signal is toggled between an active state for switch state detection and an inactive state for conserving power. A second terminal of the switch is coupled through resistive circuitry to a supply voltage node and may be coupled to an input terminal of the sensor. The comparator circuitry compares a state of the input terminal with the state value when the pulse-train voltage signal is in the active state for providing a state change signal indicative thereof.

20 Claims, 6 Drawing Sheets

SYSTEM AND METHOD OF LOW POWER SWITCH STATE DETECTION

CROSS REFERENCE TO RELATED APPLICATION(S)

This application claims the benefit of U.S. Provisional Application Ser. No. 63/074,566, filed on Sep. 4, 2020, which is hereby incorporated by reference in its entirety for all intents and purposes; this application is related to U.S. Non-provisional application Ser. No. 17/100,529, entitled "SYSTEM AND METHOD OF DIGITAL CONTINUITY TAMPER DETECTION," which is filed concurrently herewith.

BACKGROUND OF THE INVENTION

Field of the Invention

The present invention relates in general to switch state detection, and more particularly to a system and method of reducing power while detecting the state of a switch.

Description of the Related Art

Magnetic reed switches or the like are typically normally-open switches that are held in the closed position when a magnet is in close proximity. Traditional reed switch state detection uses a pull-up or pull-down resistor resulting in static current draw when the switch is closed. This static current draw can be significant and directly impacts the sleep current in a low power system powered by a battery. Because battery lifetime in a sensor application may be dominated by the sleep current, significant sleep current can reduce battery life over time.

SUMMARY OF THE INVENTION

A switch sensor for sensing a state of a switch according to embodiments described herein includes a programmable memory, pulse generation circuitry, and comparator circuitry. The switch has first and second terminals in which the second terminal of the switch is coupled through resistive circuitry to a supply voltage node, in which the resistive circuitry operates as a pullup resistance or a pulldown resistance. The memory stores a state value indicative of a detected state of the switch. The pulse generation circuitry provides a pulse-train voltage signal at an output terminal for coupling to the first end of the switch, in which the pulse-train voltage signal is toggled between an active state for switch state detection and an inactive state for conserving power. The second terminal of the switch may be coupled to an input terminal of the sensor. The comparator circuitry compares the state of the input terminal with the state value when the pulse-train voltage signal is in the active state for providing a state change signal indicative thereof.

In one embodiment, the comparator circuitry is powered up only while the pulse-train voltage signal is in the active state. The comparator circuitry may include a Boolean logic exclusive-OR gate having a first input receiving the state value, having a second input receiving a signal indicative of the input terminal, and having an output providing the state change signal.

The comparator circuitry may include buffer circuitry for buffering the input terminal and having an output providing a buffered signal, and a Boolean logic exclusive-OR gate having a first input receiving the state value, having a second input receiving the buffered signal, and having an output providing the state change signal. In one embodiment, the buffer circuitry and the exclusive-OR gate each have an enable input receiving the pulse-train voltage signal in which the comparator circuitry is powered up only while the pulse-train voltage signal is in the active state.

The comparator circuitry may include a comparator having a first input coupled to the input terminal, having a second input receiving a reference voltage, and having an output providing a sense signal, and a Boolean logic exclusive-OR gate having a first input receiving the sense signal, having a second input receiving the state value, and having an output providing the state change signal. In one embodiment, the comparator and the exclusive-OR gate each have an enable input receiving the pulse-train voltage signal in which the comparator circuitry is powered up only while the pulse-train voltage signal is in the active state.

The switch sensor may include processing circuitry that applies an active voltage level on the output terminal while sensing a state of the input terminal indicative of the detected state of the switch, and that programs the state value of the programmable memory based on the state of the input terminal while the active voltage level is applied.

The pulse generation circuitry may keep the pulse-train voltage signal at the active state during each cycle only long enough to ensure detection of a state change of the switch, and may keep the pulse-train voltage signal at the inactive state during each cycle to minimize power consumption.

The switch sensor may include interrupt circuitry that provides an interrupt when the state change signal is provided, and processing circuitry having a sleep mode that wakes up in response to the interrupt to communicate a state change of the switch and to reprogram the state value.

A method of sensing a state of a switch according to one embodiment includes programming a memory with a state value indicative of a detected state of the switch, providing a pulse-train voltage signal to a first terminal of the switch, in which the pulse-train voltage signal is toggled between an active state for switch state detection and an inactive state for conserving power, and comparing a state of the second terminal of the switch, which is coupled through resistive circuitry to a supply voltage node, with the state value and providing a state change signal indicative thereof.

The method may include powering up comparator circuitry only while the pulse-train voltage signal is in the active state. The method may include determining a Boolean exclusive-OR logic state between the second terminal of the switch and the state value for providing the state change signal.

The method may include buffering the input terminal and providing a buffered signal, and determining a Boolean exclusive-OR logic state between the buffered signal and the state value for providing the state change signal. The method may include powering up comparator circuitry only while the pulse-train voltage signal is in the active state.

The method may include comparing a state of the second terminal of the switch with the state value and providing a state signal indicative of a state of the switch, and determining a Boolean exclusive-OR logic state between the second terminal of the switch and the state signal for providing the state change signal. The method may include powering up comparator circuitry only while the pulse-train voltage signal is in the active state.

The method may include applying an active voltage level to the first terminal of the switch while sensing a state of the second terminal of the switch indicative of the current state of the switch, and programming the memory based on the state of the second terminal of the switch while the active voltage level is being applied.

The method may include keeping the pulse-train voltage signal at the active state during each cycle only long enough to ensure detection of a change of state of the switch, and keeping the pulse-train voltage signal at the inactive state during each cycle for a maximum allowable delay for switch state detection. The method may include asserting the pulse-train voltage signal to an upper voltage level for the active state and asserting the pulse-train voltage signal to a lower voltage level for the inactive state, or vice-versa. The method may include providing an interrupt when the state change signal is provided, and in response to the interrupt being provided, communicating a state change of the switch and reprogramming the state value.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
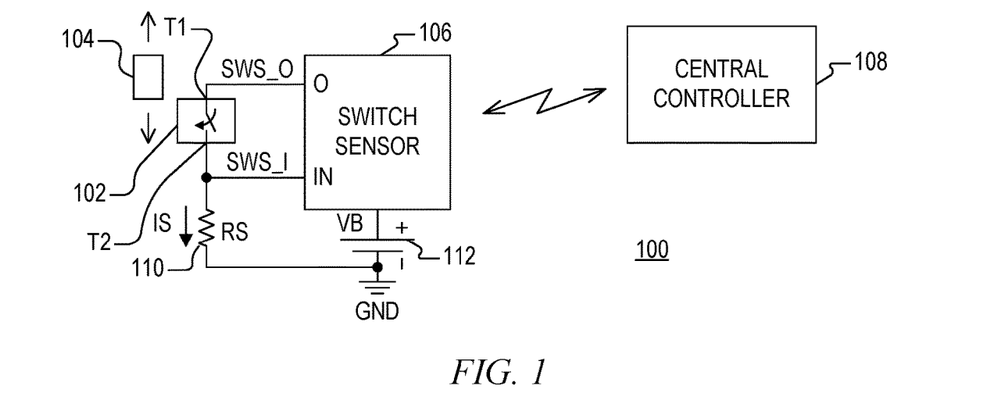
FIG. 1 is a simplified block diagram of a sensor system including a switch sensor implemented according to an embodiment of the present disclosure for detecting the state of a switch.

FIG. 1 is a simplified block diagram of a sensor system 100 including a switch sensor 106 implemented according to an embodiment of the present disclosure for detecting the state of a switch 102. The switch 102 may be in the form of a reed switch used for detecting the relative proximity of a magnet 104. In one embodiment, the switch 102 may be in the form of a 2-terminal single-pole, single-throw (SPTS) switch operated by a magnetic field. In one embodiment, the switch 102 is normally open when the magnet 104 is moved away from the switch 102, and is closed when the magnet 104 is adjacent to the switch 102. The switch 102 has a pair of terminals T1 and T2 coupled to respective terminals of the switch sensor 106. The switch sensor 106 detects the state and/or change of state of the switch 102 and communicates via wired or wireless communications with a central controller 108 or the like.

The sensor system 100 may be useful for a variety of applications including security applications and the like. As an example, the switch 102, the magnet 104, and the switch sensor 106 are mounted on or near a window or a door or the like in which the magnet 104 is moved when the window or door is opened and closed. The state of the switch 102 is detected by the switch sensor 106 indicating whether the window or door is opened or closed, and this information is communicated by the sensor 105 to the central controller 108. Communications between the switch sensor 106 and the central controller 108 may be wired or wireless. In wireless configurations, low power wireless technologies may be used, such as Bluetooth or low-energy Bluetooth (BLE) or ZigBee or the like.

In one embodiment, the switch sensor 106 includes an output (O) terminal coupled to terminal T1 of the switch 102 for providing an output switch state signal SWS_O, and an input (IN) terminal coupled to terminal T2 of the switch 102 for sensing the state of the switch 102 via a corresponding input signal SWS_I. In the illustrated embodiment of FIG. 1, a sense resistor 110 with resistance RS is coupled between terminal T1 of the switch 102 and a reference supply voltage node, such as ground (GND). Although a sense resistor is illustrated, any form of resistive circuitry may be used. A battery 112 providing a battery voltage VB is coupled between GND and a supply voltage input of the switch sensor 106. The battery voltage VB provides energy to power the switch sensor 106 and is used by the switch sensor 106 for developing the SWS_O signal used for sensing the state of the switch 102 as further described herein. The switch sensor 106 is typically configured to remain in a sleep mode for most of the time and is configured to wake up when the switch 102 changes state and to communicate change of state to the central controller 108.

When the switch 102 is closed, such as when the magnet 104 is in close proximity of the switch 102 (e.g., adjacent to the switch 102), a sense current IS flows through the sense resistor 110 to GND. In a conventional configuration, SWS_O may be a fixed direct-current (DC) voltage $V_{SWS}$ applied across the switch 102 and the sense resistor 110 to develop IS as a static current. This static current draw can be significant and directly impacts the sleep current of the switch sensor 106. As an example, when $V_{SWS}$=3 Volts (V) and RS is 3 megaohms (MΩ) and the switch 102 is closed, then IS=3V/3MΩ=1 microampere (μA). Because battery lifetime in a sensor application may be dominated by the sleep current, reducing this static switch current is desirable. As further described herein, instead of asserting SWS_O as a fixed DC voltage signal, SWS_O is a pulsed or pulsed-train voltage signal that toggles between the higher or upper voltage level of $V_{SWS}$ and a lower voltage level, such as GND, which substantially reduces the average level of IS over time.

Figure 2:
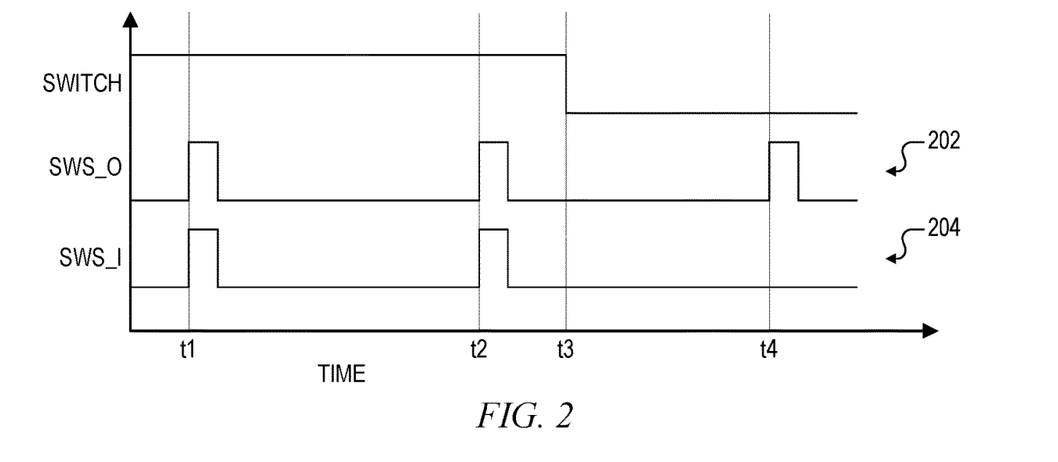
FIG. 2 is a simplified timing diagram illustrating operation for the case in which the switch sensor of FIG. 1 is configured according to one embodiment of the present disclosure to develop the switch sense signal as a pulse-train voltage signal.

FIG. 2 is a simplified timing diagram illustrating operation for the case in which the switch sensor 106 is configured according to one embodiment of the present disclosure to develop SWS_O as a pulse-train voltage signal 202. A SWITCH value and the SWS_O and SWI_I signals are plotted versus time. The SWITCH value is a virtual value that reflects the actual state of the switch 102, in which SWITCH is shown asserted high when the switch 102 is actually closed and is shown asserted low when the switch 102 is actually open. The pulse-train voltage signal 202 is provided by the switch sensor 106 via the output terminal O, and the state of the switch 102 is sensed by a corresponding input pulse-train signal 204 received at the input terminal IN of the switch sensor 106. In this manner, lower power switch state detection can be achieved by duty-cycling the pull-up supply provided to the switch 102.

In one embodiment, the pulse-train voltage signal 202 remains low for most of the time, such as pulled to GND through RS, and periodically goes high such as to the voltage level $V_{SWS}$. The state of the switch 102 is sampled periodically such as only when the pulse-train voltage signal 202 goes high to $V_{SWS}$. The input pulse-train signal 204 follows the pulse-train voltage signal 202 while the switch 102 is closed, but instead is pulled low via the resistor 110 when the switch 102 is opened. As shown, for example, the input pulse-train signal 204 follows the first 2 pulses of the SWS_O output pulse-train voltage signal 202 at sequential times t1 and t2 while the switch 102 is closed (as indicated as SWITCH high). SWITCH goes low at a time t3 indicating that the switch 102 is opened after time 2. When SWS_O next goes high at subsequent time t4 for a third pulse, SWS_I remains low since the switch 102 has been opened. In this manner, the switch sensor 106 can readily detect the state of the switch 102 within a very short period of time. Since the voltage level of SWS_O remains low most of the time and assuming the switch 102 remains closed for a significant period of time, the current IS is substantially reduced over time substantially reducing power provided by the battery 112 thus increasing battery life.

Figure 3:
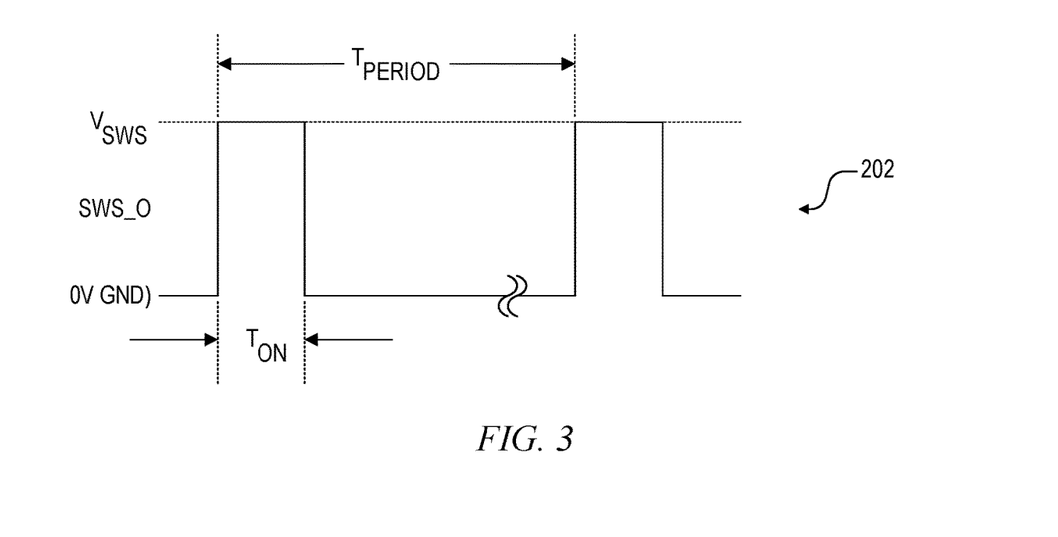
FIG. 3 is a simplified timing diagram of the pulse-train voltage signal configured according to one embodiment of the present disclosure.

FIG. 3 is a simplified plot of the SWS_O pulse-train voltage signal 202 configured according to one embodiment of the present disclosure. SWS_O goes high to the voltage level $V_{SWS}$ once every cycle in which each cycle has a period $T_{PERIOD}$, remains high for an on-time duration $T_{ON}$, and then goes low (e.g., to 0V or GND) for the remainder of the cycle. Each of successive cycles repeats in the same manner. The duty-cycled current draw (on average) through the closed switch 102 and pulldown resistor 110 is IS=$T_{ON}$/$T_{PERIOD}$ ($V_{SWS}$/RS). For example, for a frequency of 10 Hertz (Hz) ($T_{PERIOD}$=100 milliseconds (ms)), a pulse width $T_{ON}$=1000 μs, a voltage level $V_{SWS}$=3V, and a pulldown resistance of RS=3MΩ, then the static current level of IS, on average, is reduced to about 10 nanoamperes (ns). It is noted that the static current level may further be reduced if the switch 102 remains open for any significant period of time. In this manner, the static current is reduced by a factor of about 100 in the illustrated embodiment.

In one specific embodiment, the estimated battery life was increased from about 5.3 years to about 7.3 years using a configuration as described herein thereby dramatically increasing battery lifetime. Results may vary from one configuration to the next, yet it is appreciated that power consumption is significantly reduced while battery life is significantly increased. In any configuration, the on period $T_{ON}$ may be minimized to be as short as possible to have a period only sufficiently long to ensure detection of the state of the switch 102. In addition, $T_{PERIOD}$ is maximized to be as long as possible while ensuring that the state of the switch 102 is tested at an acceptable rate for the particular application. In a specific embodiment, a frequency of 10 Hz is contemplated in which the state of the switch 102 is tested once every 100 ms. The frequency may be increased or decreased depending upon a desired rate of testing the state of the switch 102 and the desired power savings. For example, the frequency could be reduced to 1 Hz to increase power savings in which the state of the switch 102 is tested once per second, or the frequency could be increased for faster detection with reduced power savings.

Figure 4:
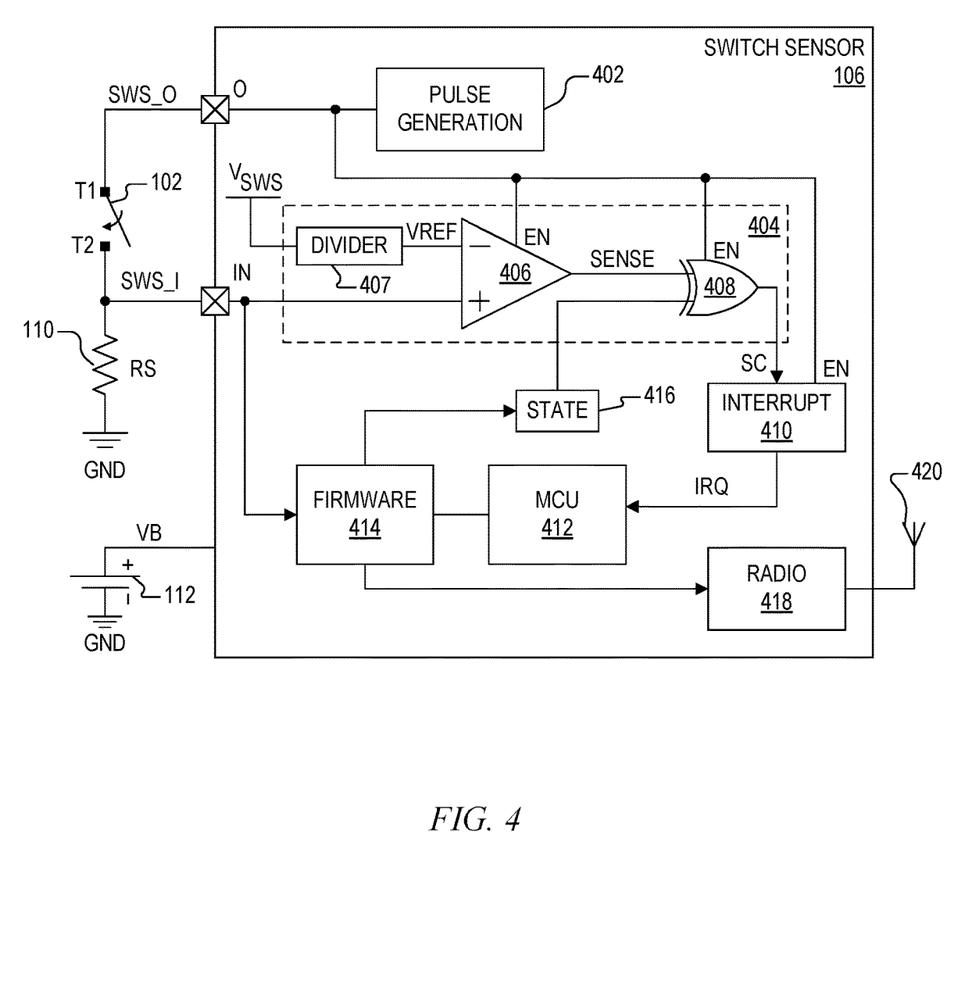
FIG. 4 is a more detailed block diagram of the switch sensor implemented according to one embodiment of the present disclosure.

FIG. 4 is a more detailed block diagram of the switch sensor 106 implemented according to one embodiment of the present disclosure. The switch sensor 106 includes pulse generation circuitry 402, comparator circuitry 404, interrupt circuitry 410, a microcontroller unit (MCU) 412, firmware 414, a programmable memory 416, and radio circuitry 418. The radio circuitry 418 communicates via an externally coupled antenna 420. Alternative wired configurations using wired communications are also contemplated. The battery 112 provides power via the battery voltage VB as previously described. The pulse generation circuitry 402 develops and provides the SWS_O signal at the output terminal O of the switch sensor 106, in which the SWS_O signal is driven according to the pulse-train voltage signal 202 previously described. In one embodiment, the pulse generation circuitry 402 is configured for low power operation in which it enters a sleep mode between pulses and awakens in response to a timer or the like (not shown) to assert the next pulse. In each embodiment described herein, the firmware 414 executed by the MCU 412 collectively forms processing circuitry controlling operation of the sensor.

The comparator circuitry 404 includes a comparator 406 and a 2-input Boolean logic exclusive-OR (XOR) gate 408. The comparator 406 and the XOR gate 408 each have an enable (EN) input receiving the SWS_O signal, in which the comparator circuitry 404 is enabled or powered up only while the SWS_O signal is pulled high to the voltage level $V_{SWS}$, but is otherwise disabled or powered down. The voltage $V_{SWS}$ is provided to the input of divider circuitry 407, which provides a divided down version of $V_{SWS}$ shown as a reference voltage VREF. In this manner, VREF has a reduced voltage level relative to $V_{SWS}$ to enable switch state detection via the IN terminal. VREF is provided to a negative or inverting input of the comparator 406, which has a positive or non-inverting input coupled to the IN terminal for receiving the SWS_I input signal and an output providing a sense signal SENSE. When enabled, the comparator 406 compares SWS_I with VREF and asserts SENSE based on a state of the switch 102.

The XOR gate 408 has a first input receiving the SENSE signal, a second input receiving a STATE value programmed within the memory 416, and an output providing a state change (SC) signal that is asserted while the XOR gate 408 is enabled and when the state of the switch 102 changes as further described herein. SC is provided to an input of the interrupt circuitry 410, which has an output providing an interrupt signal IRQ to the MCU 412. The interrupt circuitry 410 also has an EN input receiving SWS_O and thus is only enabled when SWS_O is asserted high. The MCU 412 controls operation of the switch sensor 106, in which the MCU 412 is controlled by the firmware 414. The firmware 414 controls operation of the radio circuitry 418, which wirelessly communicates via the antenna 420 with the central controller 108.

Upon power up or reset (POR), the firmware 414 controls the pulse generation circuitry 402 to drive SWS_O at the output terminal O to a high voltage level while monitoring SWS_I provided the input terminal IN for determining an initial state of the switch 102. It is noted that during POR initialization, the IRQ signal is ignored or otherwise disabled. When SWS_O is driven high, SWS_I goes high when the switch 102 is closed and is pulled low to GND via the resistor 110 when the switch 102 is closed. The firmware 414 monitors SWS_I and programs the memory 416 with the STATE value indicating the initial state of the switch 102, in which the STATE value is high or logic "1" when the switch 102 is closed and is low or logic "0" when the switch 102 is open. Once programmed, the firmware 414 instructs the pulse generation circuitry 402 to generate the pulse-train voltage signal 202 and otherwise places the switch sensor 106 in a sleep mode.

During operation, when the SWS_O asserted according to the pulse-train voltage signal 202 goes high to the voltage level $V_{SWS}$, the comparator 406 is powered up and compares SWS_I with VREF to provide SENSE indicative of the state of the switch 102. When the switch 102 is closed, the comparator 406 asserts SENSE high and when the switch 102 is open, the comparator 406 asserts SENSE low. While enabled, when the state of the switch 102 has not changed so that SENSE equals the STATE value, then the XOR gate 408 keeps SC low. When the state of the switch 102 has changed so that SENSE does not equal the STATE value, then the XOR gate 408 asserts SC is high causing the interrupt circuitry 410, now enabled, to generate an interrupt by asserting IRQ. When IRQ is asserted, the MCU 412 is awakened and the firmware 414 awakens and controls the radio circuitry 418 to communicate the change of state of the switch 102 to the central controller 108. In addition, the firmware 414 toggles the STATE value stored in the memory 416 to the opposite state to reflect the new state of the switch 102, and puts the switch sensor 106 back into sleep mode. Operation repeats in this manner.

Figure 5:
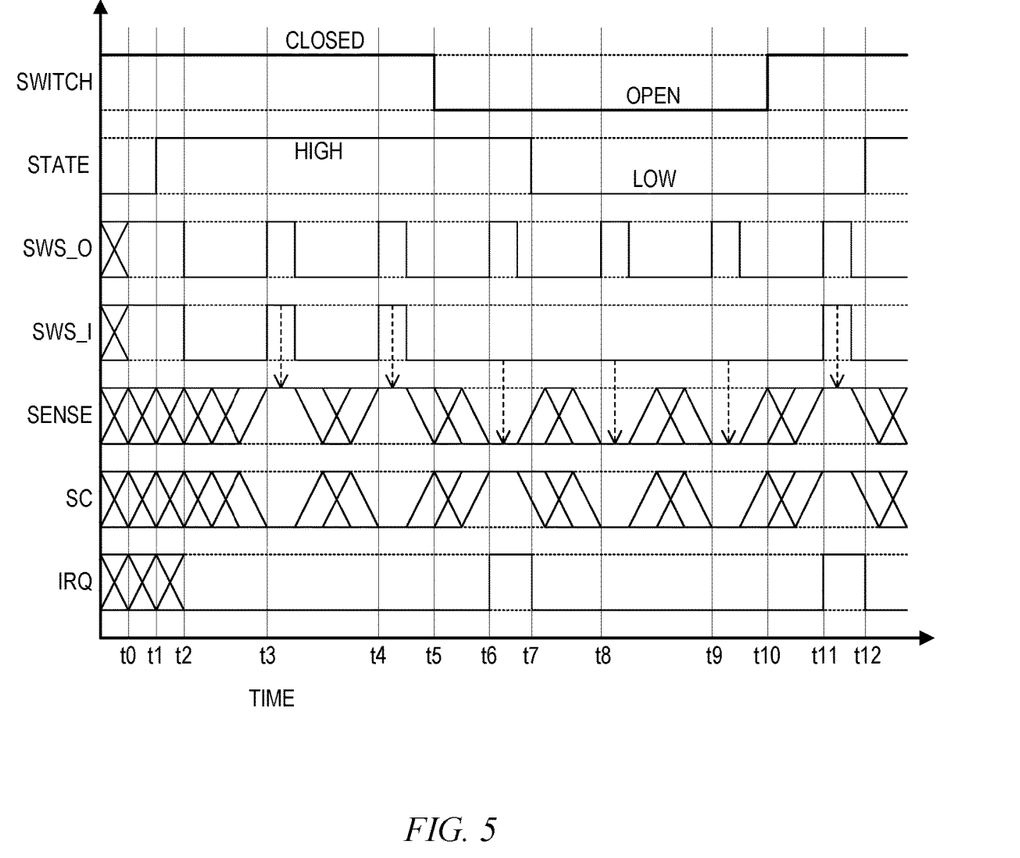
FIG. 5 is a timing diagram illustrating operation of the switch sensor of FIG. 4 according to one embodiment of the present disclosure.

FIG. 5 is a timing diagram illustrating operation of the switch sensor 106 according to one embodiment of the present disclosure. The SWITCH and STATE values and the SWS_O, SWI_I, SENSE, SC, and IRQ signals are plotted versus time. As previously described, the SWITCH value is a virtual value that reflects the actual state of the switch 102, in which SWITCH is shown asserted high when the switch 102 is actually closed and is shown asserted low when the switch 102 is actually open. SWITCH is shown initially high indicating that the switch 102 is initially closed. The STATE value is shown initially low although its initial state is arbitrary. The states of SWS_O, SWS_I, SENSE, SC and IRQ are initially shown as unknown or "don't care" prior to an initial time t0. The waveforms are shown in simplified form without delays.

Upon POR, the switch sensor 106 powers up and the firmware 414 controls the pulse generation circuitry 402 to drive SWS_O high at about time t0. Since the switch 102 is closed as indicated by the SWITCH signal, SWS_I is driven high just after time t0. The firmware 414 monitors the SWS_I signal just after time t0 to detect that the switch 102 is closed, and programs the STATE value high at a subsequent time t1 to reflect the actual state of the switch 102. Then at subsequent time t2, the firmware 414 controls the pulse generation circuitry 402 to begin driving the SWS_O signal in the form of the pulse-train voltage signal 202 previously described. The SENSE, SC, and IRQ signals are shown as "don't care" up to time t2 since not monitored during initialization. It is noted that the timing of the illustrated SWS_O signal is not shown to scale in which the width of each pulse is much wider and the corresponding duty cycle is much larger than in an actual configuration to better illustrate switching operation. In an actual configuration, the widths of the pulses relative to the overall period of each SWS_O cycle are substantially narrower for most configurations.

After time t2 during normal operation, while SWS_O is pulled low, the comparator circuitry 404 is disabled or powered down and the values of SENSE and SC are "don't care." Also while SWS_O is pulled low, although the interrupt circuitry 410 is also disabled or powered down, the IRQ signal is latched or held low. When the interrupt circuitry 410 is enabled or powered up by the SWS_O signal going high, the IRQ signal remains low unless pulled high by the SC signal. In other words, IRQ only goes high when the interrupt circuitry 410 is enabled and SC is high.

SWS_O is pulsed high beginning at subsequent time t3. Since the switch 102 is closed, SWS_I goes high and the comparator 406 asserts SENSE high. Since SENSE and STATE are both high, SC remains low so that IRQ also remains low. SWS_O is again pulsed high beginning at subsequent time t4. Since the switch 102 is closed and STATE is high, operation is the same so that SC and IRQ remain low. At subsequent time t5 before SWS_O is next pulsed high, the switch 102 is opened as indicated by SWITCH going low. When SWS_O is pulsed high again beginning at subsequent time t6, SWS_I remains low so that SENSE is also asserted low. Since SENSE and STATE are now at different states, the XOR gate 408 asserts SC high indicating that the switch 102 has changed state from closed to open.

In response to SC going high during the pulse at time t6, the interrupt circuitry 410 asserts IRQ high. In response to IRQ going high, the MCU 412 is awakened and the firmware 414 toggles STATE low at subsequent time t7 to indicate that the state of the switch 102 is now open, and the firmware 414 also clears IRQ low at about time t7. In addition, the firmware 414 awakens the radio circuitry 418 to communicate the change of state to the central controller 108 as previously described. The firmware 414 then instructs that the switch sensor 106 go back to sleep mode.

SWS_O is next pulsed high beginning at subsequent time t8. Since the switch 102 is now open, SWS_I remains low so that the comparator 406 asserts SENSE low. Since SENSE and STATE are both low, SC remains low so that IRQ also remains low. SWS_O is again pulsed high beginning at subsequent time t4. Since the switch 102 is closed and STATE is high, operation is the same so that SC and IRQ remain low. SWS_O is again pulsed high beginning at subsequent time t9. Since the switch 102 is open and STATE is low, operation is the same so that SC and IRQ remain low. At subsequent time t10 before SWS_O is next pulsed high, the switch 102 is closed as indicated by SWITCH going back high. When SWS_O is pulsed high again beginning at subsequent time t11, SWS_I is pulled high so that SENSE is also asserted high. Since SENSE and STATE are now at different states, the XOR gate 408 asserts SC high indicating that the switch 102 has changed state from closed to open.

In response to SC going high during the pulse at time t11, the interrupt circuitry 410 asserts IRQ high. In response to IRQ going high, the MCU 412 is awakened and the firmware 414 toggles STATE high at subsequent time t12 to indicate that the state of the switch 102 is now closed, and the firmware 414 also clears IRQ low at about time t12. In addition, the firmware 414 awakens the radio circuitry 418 to communicate the change of state to the central controller 108 as previously described. The firmware 414 then instructs that the switch sensor 106 go back to sleep mode. Operation repeats in the manner in subsequent cycles or until power down and the next POR.

Figure 6:
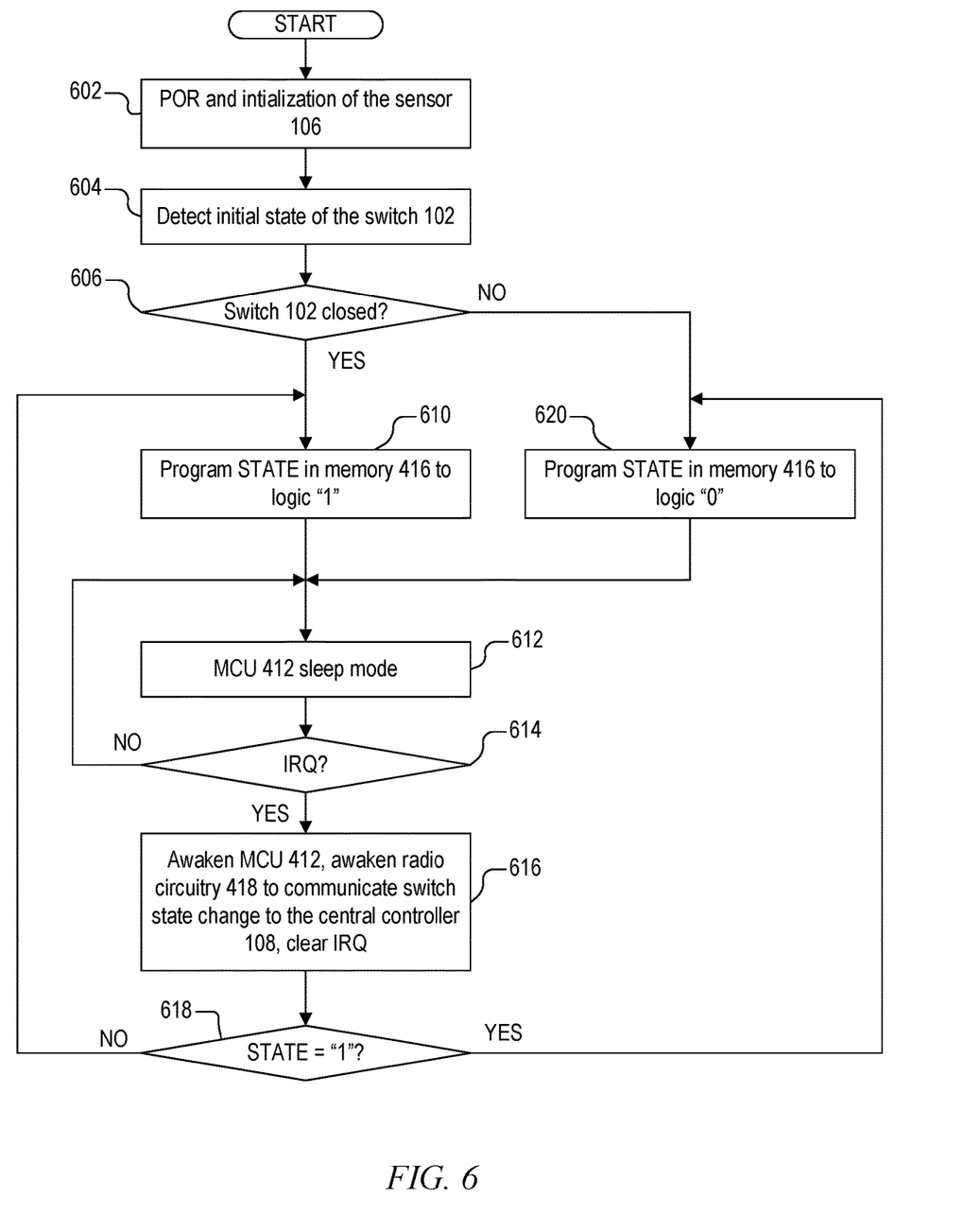
FIG. 6 is a flowchart diagram illustrating operation of the switch sensor of FIG. 4 according to one embodiment of the present disclosure.

FIG. 6 is a flowchart diagram illustrating operation of the switch sensor 106 according to one embodiment of the present disclosure. At first block 602, the switch sensor 106 is initialized such as at POR. At next block 604, the initial state of the switch 102 is detected as being either open or closed. In one embodiment, for example, the firmware 414 controls the pulse generation circuitry 402 to drive the SWS_O signal at the O terminal to the voltage level $V_{SWS}$ and then samples the voltage at IN terminal to determine the initial state of the switch 102. If IN is high at the voltage level $V_{SWS}$, then the switch 102 is initially closed, but if SWS_I is low, then the switch 102 is initially open. At next block 606, it is queried whether the switch 102 is initially open or closed as was detected at block 604. If the switch 102 is closed, operation advances to block 610 in which the STATE value in the memory 416 is set to logic "1". If instead the switch 102 is open at block 606, operation advances instead to block 620 in which the STATE value is set equal to logic "0". Operation then advances to block 612 from either block 610 or 620 in which the MCU 412 and other circuitry of the switch sensor 106 is put to sleep mode.

At next block 614, it is queried whether the interrupt signal IRQ has been provided. While IRQ is not asserted, meaning that the state of the switch 102 has not changed, then the MCU 412 remains in low power sleep mode represented as looping between blocks 612 and 614. When IRQ is asserted, operation advances to block 616 in which the MCU 412 is awakened, the firmware 414 awakens the radio circuitry 418 to communicate the change of state of the switch 102 to the central controller 108, and IRQ is cleared. Operation then advances to block 618 to query the logic state of the STATE value in the memory 416. If the STATE value is a logic "1" (e.g., STATE=1) since the switch 102 was closed, then operation advances to block 620 to change the STATE value to logic "0" since the switch 102 is now open. If instead the STATE value is not logic "1", such as when set false at block 620 since the switch 102 was open, then operation advances instead to block 610 to change the STATE value to logic "1" since the switch 102 is now closed. Operation repeats in similar manner in which the STATE value is toggled between logic "1" and "0" with changes of the state of the switch 102 in subsequent cycles of SWS.

In summary, the switch sensor 106 detects the initial state of the switch 102 and sets corresponding internal values and flags and may communicate initial status to the central controller 108. The MCU 412 and other circuitry goes to sleep to conserve energy. The pulse generation circuitry 402 may be configured to go to sleep after initialization and between pulses and to awaken periodically based on the frequency of SWS_O to output a pulse on SWS_O. The comparator circuitry 404 is powered up or enabled each time SWS_O goes high to detect the SWS_I signal, to assert the SENSE signal based on SWS_I, and to assert SC based on comparing SENSE with STATE. Upon a change of state of the switch 102, the XOR gate 408 asserts SC, the interrupt circuitry 410 generates an interrupt by asserting IRQ, the MCU 412 wakes up, the firmware 414 updates flags and values including the STATE value in the memory 416, and awakens the radio circuitry 418 to communicate the state changes to the central controller 108 such as via wired or wireless communications. The switch sensor 106 may go back to sleep and operation repeats in this manner. The use of the pulse-train voltage signal 202 rather than a steady state voltage level at the output of the switch sensor 106 saves a significant amount of power and increases battery life particularly when the switch 102 is closed during normal operation.

Figure 7:
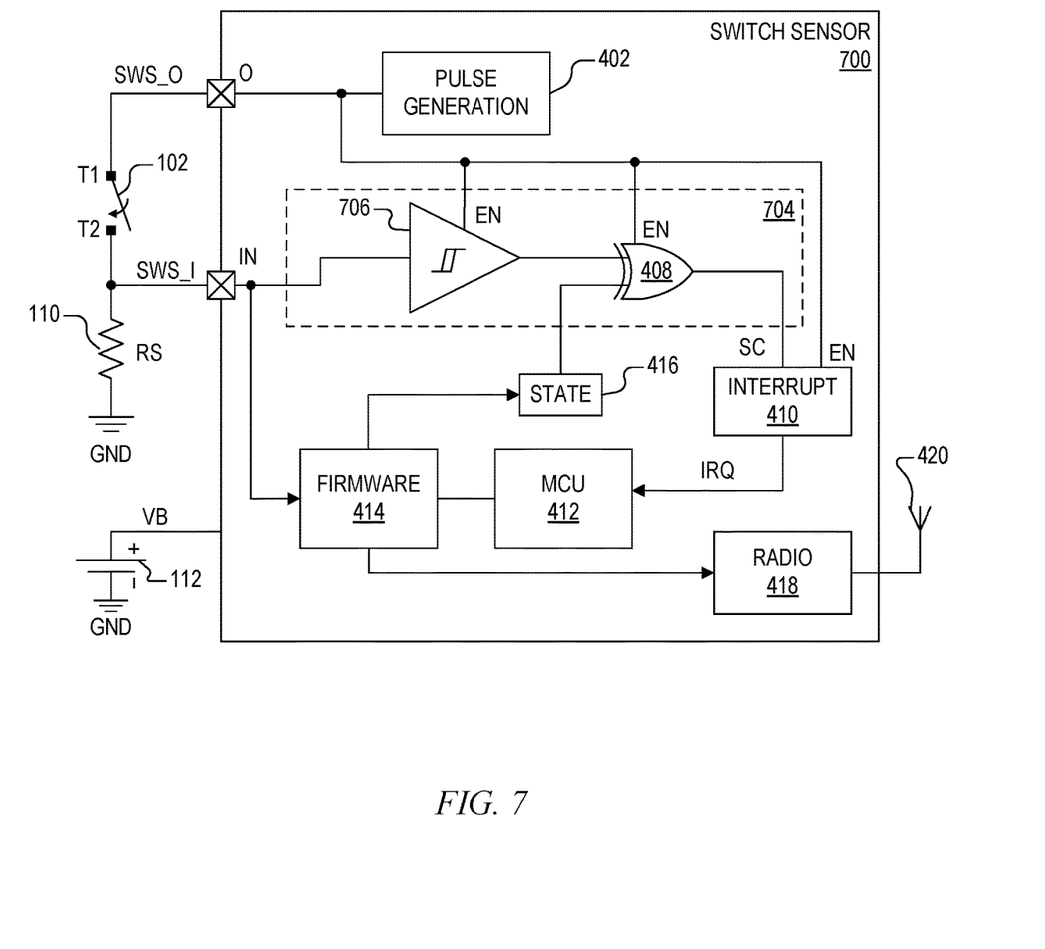
FIG. 7 is a simplified block diagram of a portion of a switch sensor implemented according to a digital embodiment of the present disclosure.

FIG. 7 is a simplified block diagram of a portion of a switch sensor 700 implemented according to a digital embodiment of the present disclosure. The switch sensor 700 is substantially similar to the switch sensor 106 except that the comparator circuitry 404 is replaced by similar comparator circuitry 704. The comparator circuitry 704 includes the XOR gate 408 but the comparator 406 is replaced by buffer circuitry 706. In one embodiment, the buffer circuitry 706 may be configured as a Schmitt trigger device with hysteresis or the like to filter out spurious fluctuations. The XOR gate 408 and the buffer circuitry 706 have enable inputs EN receiving the SWS_O signal in a similar manner as previously described. The SWS_I signal is provided to an input of the buffer circuitry 706, having its output provided to one input of the XOR gate 408, which receives the STATE value in the memory 416 at its other input. The output of the XOR gate 408 provides the SC signal to the interrupt circuitry 410. The remaining portions and circuitry of the switch sensor 700 are substantially the same and operate in a substantially similar manner, including the pulse generation circuitry 402, the interrupt circuitry 410, the MCU 412, the firmware 414, and the radio circuitry 418. The antenna 420 is provided and coupled in similar manner. The switch 102 has its terminals T2 and T1 coupled to the input IN and output O terminals, respectively, of the switch sensor 700 in similar manner. The resistor 110 is coupled between the IN terminal and GND in similar manner, and the battery 112 providing supply voltage 112 is provided and coupled in similar manner.

In operation, the firmware 414 detects the initial state of the switch 102 and programs the STATE value in the same manner, in which STATE is programmed to logic "1" when the switch 102 is initially closed and is programmed to logic "0" when the switch 102 is initially open. The pulse generation circuitry 402 provides SWS_O in the form of the pulse-train voltage signal 202 in similar manner during normal operation; the pulse generation circuitry 402 may be in a sleep or low power mode between pulses while SWS_O is low. The XOR gate 408, the buffer circuitry 706, and the interrupt circuitry 410 are powered up or enabled when SWS_O is pulsed high to $V_{SWS}$ in similar manner. In the case of the switch sensor 700, however, the XOR gate 408 compares a buffered version of SWS_I with STATE to provide the SC signal, in which SC is asserted high when the state of the switch 102 is detected changed from its initial state during the enable periods (when SWS_O) is high. The MCU 412 enters the low power or sleep mode while IRQ is not asserted, and then wakes up when IRQ is asserted. The firmware 414 toggles STATE, clears IRQ, awakens the radio circuitry 418 to communicate a change of state of the switch 102, and then commands the switch sensor 700 to re-enter low power or sleep mode operation.

Figure 8:
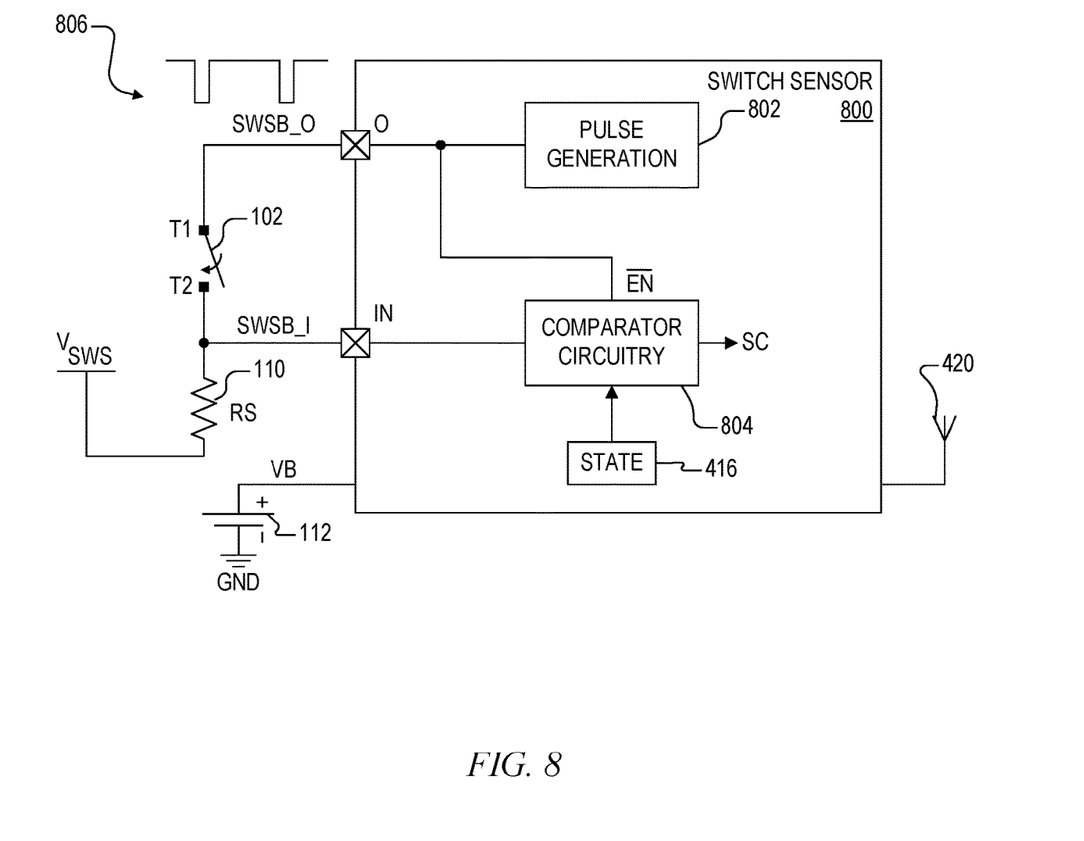
FIG. 8 is a simplified block diagram of a portion of a switch sensor implemented according to an alternative embodiment of the present disclosure.

FIG. 8 is a simplified block diagram of a portion of a switch sensor 800 implemented according to an alternative embodiment of the present disclosure. The switch sensor 800 includes the input IN and output O terminals externally coupled to the switch 102 in the same manner, and the battery 112 and antenna 420 are shown coupled in the same manner. The resistor 110 is also shown having one end coupled to the terminal T2 of the switch 102, except that its other end is coupled to the voltage level $V_{SWS}$ rather than to GND. In this manner, the resistor 110 operates as a pullup resistor rather than a pulldown resistor. $V_{SWS}$ may be provided by external circuitry (not shown) converting VB or may be provided by the switch sensor 800.

The pulse generation circuitry 402 is replaced by pulse generation circuitry 802 which operates in a similar yet inverted manner. In particular, the output of the pulse generation circuitry 802 coupled to the output terminal O provides a signal SWSB_O, which is a similar but inverted version of SWS_O. In particular, SWSB_O is also a pulse-train voltage signal 806 which is an inverted version of the pulse-train voltage signal 202. As shown, the SWSB_O signal is inactive when pulled high to the voltage level $V_{SWS}$, and active when pulsed low, in which SWSB_O may have the same or similar low pulse may have the same or similar period $T_{PERIOD}$ and the same on-time duration $T_{ON}$, except that the on-time period $T_{ON}$ occurs when SWSB_O is pulsed low rather than high during each cycle. The pulse generation circuitry 802 may also have low power operation in which it is in low power mode between pulses while SWSB_O is latched high, but enabled each cycle to assert a low pulse.

The comparator circuitry 404 or the comparator circuitry 704 is replaced by similar comparator circuitry 804, which represents either the analog version (404) or the digital version (704). The SWSB_O signal may be used as an enable signal to power up or enable the comparator circuitry 804, except that it is active when pulsed low and is instead provided to an inverted enable input $\overline{EN}$ of the comparator circuitry 804. The inverted enable input may operate to provide a ground or low reference signal to enable the comparator circuitry 804 when pulled low in either case. When the comparator circuitry 804 is configured using the comparator 406 in a similar manner as the comparator circuitry 404 for the analog configuration, then the inputs to the comparator 406 are reversed such that VREF is provided to the positive input and the IN terminal is coupled to the negative input for receiving a corresponding input signal SWSB_I. The switch sensor 800 includes the memory 416 storing the STATE value programmed by the firmware 414, except that STATE is programmed in reverse or inverted manner to a logic "1" when the switch 102 is open and is programmed to a logic "0" when the switch 102 is closed.

Operation of the switch sensor 800 is similar to operation of the sensors 106 and 700 previously described. When the switch 102 is open, then the SWSB_I signal is pulled high to $V_{SWS}$ regardless of the state of the SWSB_O signal. When the switch 102 is closed, then the SWSB_I signal is pulled low when SWSB_O is pulsed low. When the STATE value is programmed with logic "0" indicating that the switch 102 was previously detected as being closed, then the comparator circuitry 804 asserts SC high indicating a state change when SWSB_I is detected high while SWSB_O is pulled low. In a similar manner, when the STATE value is programmed with logic "1" indicating that the switch 102 was previously detected as being open, then the comparator circuitry 804 asserts SC high indicating a state change when SWSB_I is detected low while SWSB_O is pulled low. In a similar manner previously described, the interrupt signal IRQ is asserted when SC is asserted indicating a state change, in which the firmware 414 of the switch sensor 800 awakens the radio circuitry 418 to communicate a state change to the central controller 108. The switch sensor 800 remains in low power or sleep mode for most of the time in a similar manner as described for the sensors 106 and 700.

It is noted that GND and $V_{SWS}$ may each be referred to as supply voltage nodes, in which GND serves as a reference supply voltage level relative to the supply voltage level $V_{SWS}$. In any of the embodiments described herein, one terminal of the switch 102 is coupled through resistive circuitry, such as the resistor 110, to a supply voltage node. The supply voltage node is ground for the sensors 106 or 700 or $V_{SWS}$ for the switch sensor 800. The pulse-train voltage signal toggles between an inactive state used for conserving power and an active state for switch state detection. The active state of the pulse-train voltage signal 202 for the sensors 106 or 700 is a high voltage level, such as $V_{SWS}$, and the inactive state is a low voltage level, such as GND. The active state of the pulse-train voltage signal 806 for the switch sensor 800, however, is a low voltage level, such as GND, and the inactive state is a high voltage level, such as $V_{SWS}$ or the like.

For either of the configurations, operation in substantially similar manner. In the case of the switch sensor 800, the IN terminal is pulled high to $V_{SWS}$ so that little current flows through the resistor 110 when the switch 102 is open. When the switch 102 is closed, SWSB_O remains at the high voltage level $V_{SWS}$ for most of the time substantially reducing current flow through the resistor 110 over time. When the switch 102 is closed, current only flows through the resistor 110 when SWSB_O is pulsed low for the period $T_{ON}$, which is a relatively short time compared to the overall period $T_{PERIOD}$ of SWSB_O. In this manner, substantial power savings is achieved over time.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A switch sensor for sensing a state of a switch having first and second terminals wherein the second terminal of the switch is coupled through resistive circuitry to a supply voltage node, the switch sensor comprising:
   a programmable memory that stores a state value indicative of a detected state of the switch;
   pulse generation circuitry that provides a pulse-train voltage signal at an output terminal for coupling to the first end of the switch, wherein the pulse-train voltage signal is toggled between an active state for switch state detection and an inactive state for conserving power;
   an input terminal for coupling to the second terminal of the switch; and
   comparator circuitry that compares a state of the input terminal with the state value when the pulse-train voltage signal is in the active state for providing a state change signal indicative thereof.

2. The switch sensor of claim 1, wherein the comparator circuitry is powered up only while the pulse-train voltage signal is in the active state.

3. The switch sensor of claim 1, wherein the comparator circuitry comprises a Boolean logic exclusive-OR gate having a first input receiving the state value, having a second input receiving a signal indicative of the input terminal, and having an output providing the state change signal.

4. The switch sensor of claim 1, wherein the comparator circuitry comprises:
   buffer circuitry having an input coupled to the input terminal and having an output providing a buffered signal; and
   a Boolean logic exclusive-OR gate having a first input receiving the state value, having a second input receiving the buffered signal, and having an output providing the state change signal.

5. The switch sensor of claim 4, wherein the buffer circuitry and the exclusive-OR gate each have an enable input receiving the pulse-train voltage signal in which the comparator circuitry is powered up only while the pulse-train voltage signal is in the active state.

6. The switch sensor of claim 1, wherein the comparator circuitry comprises:
a comparator having a first input coupled to the input terminal, having a second input receiving a reference voltage, and having an output providing a sense signal; and
a Boolean logic exclusive-OR gate having a first input receiving the sense signal, having a second input receiving the state value, and having an output providing the state change signal.

7. The switch sensor of claim 6, wherein the comparator and the exclusive-OR gate each have an enable input receiving the pulse-train voltage signal in which the comparator circuitry is powered up only while the pulse-train voltage signal is in the active state.

8. The switch sensor of claim 1, further comprising processing circuitry that applies an active voltage level on the output terminal while sensing a state of the input terminal indicative of the detected state of the switch, and that programs the state value of the programmable memory based on the state of the input terminal while the active voltage level is applied.

9. The switch sensor of claim 1, wherein the pulse generation circuitry keeps the pulse-train voltage signal at the active state during each cycle sufficiently long enough to ensure detection of a state change of the switch, and wherein the pulse generation circuitry keeps the pulse-train voltage signal at the inactive state during each cycle to minimize power consumption.

10. The switch sensor of claim 1, further comprising:
interrupt circuitry that provides an interrupt when the state change signal is provided; and
processing circuitry having a sleep mode that wakes up in response to the interrupt to communicate a state change of the switch and to reprogram the state value.

11. A method of sensing a state of a switch having first and second terminals wherein the second terminal of the switch is coupled through resistive circuitry to a supply voltage node, the method comprising:
programming a memory with a state value indicative of a detected state of the switch;
providing a pulse-train voltage signal to the first terminal of the switch, wherein the pulse-train voltage signal is toggled between an active state for switch state detection and an inactive state for conserving power; and
comparing a state of the second terminal of the switch with the state value and providing a state change signal indicative thereof.

12. The method of claim 11, wherein the comparing further comprises powering up comparator circuitry only while the pulse-train voltage signal is in the active state.

13. The method of claim 11, wherein the comparing comprises determining a Boolean exclusive-OR logic state between the second terminal of the switch and the state value for providing the state change signal.

14. The method of claim 11, wherein the comparing comprises:
buffering the input terminal and providing a buffered signal; and
determining a Boolean exclusive-OR logic state between the buffered signal and the state value for providing the state change signal.

15. The method of claim 14, wherein the comparing further comprises powering up comparator circuitry only while the pulse-train voltage signal is in the active state.

16. The method of claim 11, wherein the comparing comprises:
comparing a state of the second terminal of the switch with the state value and providing a state signal indicative of a state of the switch; and
determining a Boolean exclusive-OR logic state between the second terminal of the switch and the state signal for providing the state change signal.

17. The method of claim 16, wherein the comparing further comprises powering up comparator circuitry only while the pulse-train voltage signal is in the active state.

18. The method of claim 11, further comprising:
applying an active voltage level to the first terminal of the switch while sensing a state of the second terminal of the switch indicative of the current state of the switch; and
wherein the programming comprises programming the memory based on the state of the second terminal of the switch while the active voltage level is being applied.

19. The method of claim 11, wherein the providing a pulse-train voltage signal comprises keeping the pulse-train voltage signal at the active state during each cycle only long enough to ensure detection of a change of state of the switch, and keeping the pulse-train voltage signal at the inactive state during each cycle for a maximum allowable delay for switch state detection.

20. The method of claim 11, further comprising providing an interrupt when the state change signal is provided, and in response to the interrupt being provided, communicating a state change of the switch and reprogramming the state value.

* * * * *